(12) United States Patent
Okuda

(10) Patent No.: US 11,984,913 B2
(45) Date of Patent: May 14, 2024

(54) MULTIPLEXER

(71) Applicant: Murata Manufacturing Co., Ltd., Nagaokakyo (JP)

(72) Inventor: Tetsuro Okuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 367 days.

(21) Appl. No.: 17/341,477

(22) Filed: Jun. 8, 2021

(65) Prior Publication Data

US 2021/0297097 A1    Sep. 23, 2021

Related U.S. Application Data

(63) Continuation of application No. PCT/JP2019/044352, filed on Nov. 12, 2019.

(30) Foreign Application Priority Data

Dec. 20, 2018    (JP) .................................. 2018-238056

(51) Int. Cl.
| | | |
|---|---|---|
| *H04B 1/00* | (2006.01) | |
| *H03H 3/02* | (2006.01) | |
| *H03H 9/64* | (2006.01) | |
| *H04B 1/04* | (2006.01) | |

(52) U.S. Cl.
CPC ............. *H04B 1/0078* (2013.01); *H03H 3/02* (2013.01); *H03H 9/6483* (2013.01);
(Continued)

(58) Field of Classification Search
CPC ............... H03H 2003/027; H03H 3/02; H03H 9/02015; H03H 9/6483; H03H 9/706;
(Continued)

(56) References Cited

U.S. PATENT DOCUMENTS

| | | | | |
|---|---|---|---|---|
| 2007/0030096 A1* | 2/2007 | Nishihara | .............. | H03H 9/605 |
| | | | | 333/133 |
| 2016/0049920 A1* | 2/2016 | Kishino | ................. | H03H 9/725 |
| | | | | 343/858 |

(Continued)

FOREIGN PATENT DOCUMENTS

| | | |
|---|---|---|
| JP | 2007-074698 A | 3/2007 |
| WO | 2014/133084 A1 | 9/2014 |

(Continued)

OTHER PUBLICATIONS

Official Communication issued in International Patent Application No. PCT/JP2019/044352, dated Dec. 24, 2019.

*Primary Examiner* — Tan H Trinh
(74) *Attorney, Agent, or Firm* — Keating & Bennett, LLP

(57) ABSTRACT

A multiplexer includes a first filter on a first path, a second filter on a second path, and a third filter on a third path. A frequency of intermodulation distortion generated by a transmission signal within a pass band of the first filter and a transmission signal within a pass band of the second filter is within a pass band of the third filter. The first filter includes one or more series resonators on the first path and one or more parallel resonators on one or more paths connecting one or more nodes on the first path to a ground. A relative permittivity of a resonator of the one or more series resonators and the one or more parallel resonators that is closest to a common terminal is lowest among relative permittivities of the resonators.

17 Claims, 6 Drawing Sheets

(52) U.S. Cl.
CPC ......... *H04B 1/0057* (2013.01); *H04B 1/0483* (2013.01); *H03H 2003/027* (2013.01)

(58) Field of Classification Search
CPC .... H03H 9/725; H04B 1/0057; H04B 1/0078; H04B 1/0483; H04B 1/525
USPC ...................................................... 455/552.1
See application file for complete search history.

(56) References Cited

U.S. PATENT DOCUMENTS

| | | | |
|---|---|---|---|
| 2016/0118956 A1* | 4/2016 | Kihara | H03H 9/02992 333/195 |
| 2016/0359468 A1 | 12/2016 | Taniguchi et al. | |
| 2019/0123720 A1* | 4/2019 | Takamine | H04B 1/0057 |
| 2019/0149312 A1 | 5/2019 | Takamine | |
| 2019/0326884 A1* | 10/2019 | Nosaka | H03H 9/6483 |
| 2020/0153411 A1* | 5/2020 | Mukai | H03H 9/6483 |
| 2020/0195230 A1* | 6/2020 | Nosaka | H03H 9/6483 |
| 2020/0280301 A1* | 9/2020 | Konaka | H03H 9/205 |
| 2020/0280303 A1* | 9/2020 | Takamine | H03H 9/14502 |
| 2020/0295737 A1* | 9/2020 | Takata | H03H 9/6483 |
| 2020/0328728 A1* | 10/2020 | Nakagawa | H03H 9/706 |

FOREIGN PATENT DOCUMENTS

| | | |
|---|---|---|
| WO | 2015/002047 A1 | 1/2015 |
| WO | 2015/151706 A1 | 10/2015 |
| WO | 2018/003297 A1 | 1/2018 |

\* cited by examiner $2f_{B1Tx} - f_{B3Tx} \approx f_{B1Rx}$

MULTIPLEXER

CROSS REFERENCE TO RELATED APPLICATIONS

This application claims the benefit of priority to Japanese Patent Application No. 2018-238056 filed on Dec. 20, 2018 and is a Continuation Application of PCT Application No. PCT/JP2019/044352 filed on Nov. 12, 2019. The entire contents of each application are hereby incorporated herein by reference.

BACKGROUND OF THE INVENTION

1. Field of the Invention

The present invention relates to a multiplexer.

2. Description of the Related Art

In recent years, multiplexers including an acoustic wave filter have been widely used. In acoustic wave filters, IMD (Intermodulation Distortion) is likely to occur due to non-linearity of the acoustic wave filters.

When two or more signals of different frequencies are input to an acoustic wave filter as a nonlinear device, a composite signal of a frequency based on a combination of sums or differences of the frequencies is generated due to IMD. In the case where the frequency of the composite signal is within a frequency band of use of another filter, the signal is an interfering wave.

Such IMD causes an adverse influence, such as degradation of reception sensitivity of a filter. In particular, with CA (Carrier Aggregation), such influence increases as the number of Bands in which simultaneous transmission is performed increases. Thus, preventive measures against this problem are required to be taken.

For example, in Japanese Unexamined Patent Application Publication No. 2007-074698, any resonator (in an example, a series arm at an antenna end) of a transmission filter formed as a ladder filter is divided, so that the area of the resonator increases, and power consumption per unit area decreases. Thus, the occurrence of IMD is reduced.

However, in the case of a multiplexer, due to the relationship between a resonator near an ANT end, which is most affected by IMD, and a filter to which the resonator is commonly connected, there are constraints described below when dividing the resonator so that the area of the resonator increases. That is, because the area and the impedance (capacitance) of the resonator are proportional to each other, the impedance also varies. Variations in the impedance on the ANT end side affect characteristics of the filter to which the resonator is commonly connected. Thus, increasing the area of the resonator near the ANT end, which is intended by Japanese Unexamined Patent Application Publication No. 2007-074698, may not be possible, and the effect of reducing IMD may not be sufficiently achieved.

SUMMARY OF THE INVENTION

Preferred embodiments of the present invention provide multiplexers each including a plurality of acoustic wave filter and which each effectively reduce an occurrence of IMD without an optimally designed impedance being varied.

A multiplexer according to a preferred embodiment of the present invention includes a first filter on a first path connecting a common terminal to a first terminal and a second filter on a second path connecting the common terminal to a second terminal. A frequency of intermodulation distortion generated by a first signal of a frequency within a pass band of the first filter and a second signal of a frequency within a pass band of the second filter is within the pass band of the second filter. At least one of the first filter and the second filter includes a plurality of acoustic wave resonators. A relative permittivity of an acoustic wave resonator of the plurality of acoustic wave resonators that is closest to the common terminal is lowest among relative permittivities of the plurality of acoustic resonators.

Furthermore, a multiplexer according to a preferred embodiment of the present invention includes a first filter on a first path connecting a common terminal to a first terminal, a second filter on a second path connecting the common terminal to a second terminal, and a third filter on a third path connecting the common terminal to a third terminal. A frequency of intermodulation distortion generated by a first signal of a frequency within a pass band of the first filter and a second signal of a frequency within a pass band of the second filter is within a pass band of the third filter. At least one of the first filter and the second filter includes a plurality of acoustic wave resonators. A relative permittivity of an acoustic wave resonator of the plurality of acoustic wave resonators that is closest to the common terminal is lowest among relative permittivities of the plurality of acoustic wave resonators.

With the configurations described above, the relative permittivity of the resonator that is closest to the common terminal, that is, the resonator in which IMD is most likely to occur because electric power of a signal is most likely to be concentrated in the resonator, out of resonators in at least one of the first filter and the second filter, is set to be lowest among the relative permittivities of the plurality of acoustic wave resonators. Therefore, the area of the resonator in the piezoelectric substrate increases so that a capacitance obtained with optimal design can be achieved, and power consumption per unit area decreases. Therefore, IMD that occurs in the resonator is reduced. The relative permittivity of the resonator in which electric power of a signal is most likely to be concentrated is set to be low. Thus, while there is a disadvantage that the size of the resonator is increased, the effect of reducing IMD is able to be improved or maximized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to drawings. The preferred embodiments described herein illustrate either general or specific examples. Numerical values, shapes, materials, components, and arrangements and structures of connections of the components described in the preferred embodiments are merely examples, and are not intended to limit the present invention.

First Preferred Embodiment

A multiplexer according to a first preferred embodiment of the present invention will be described using a quadplexer as an example.

Figure 1:
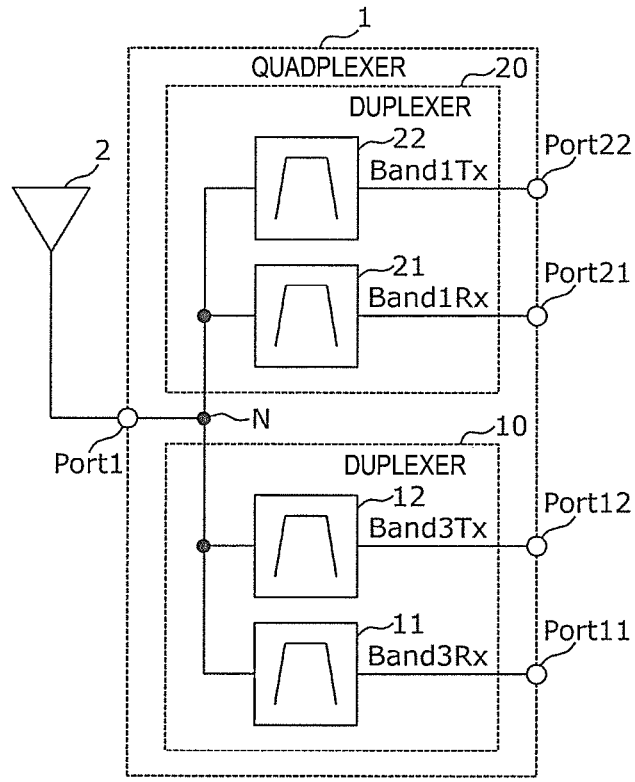
FIG. 1 is a block diagram illustrating an example of a basic configuration of a multiplexer according to a preferred embodiment of the present invention.

FIG. 1 is a block diagram illustrating an example of the functional configuration of a basic quadplexer according to the present preferred embodiment. In FIG. 1, an antenna element 2 that is connected to a common terminal Port1 of a quadplexer 1 is also illustrated.

The quadplexer 1 supports, for example, LTE® (Long Term Evolution), and transmits high frequency signals in Bands, which will be described later, defined by 3GPP® (Third Generation Partnership Project).

As illustrated in FIG. 1, the quadplexer 1 includes the common terminal Port1, four individual terminals Port11, Port12, Port21, and Port22, and four filters 11, 12, 21, and 22.

The common terminal Port1 is provided in common for the four filters 11, 12, 21, and 22 and is connected to the filters 11, 12, 21, and 22 inside the quadplexer 1. Furthermore, the common terminal Port1 is connected to the antenna element 2 outside the quadplexer 1. That is, the common terminal Port1 also defines and functions as an antenna terminal of the quadplexer 1.

The individual terminals Port11, Port12, Port21, and Port22 are provided in association with the filters 11, 12, 21, and 22, respectively, and are connected to the corresponding filters inside the quadplexer 1. Furthermore, the individual terminals Port11, Port12, Port21, and Port22 are connected to an RF signal processing circuit (for example, RFIC: Radio Frequency Integrated Circuit, not illustrated in the drawing), with an amplifying circuit or the like (not illustrated in the drawing) interposed therebetween, outside the quadplexer 1.

The filter 11 is a reception filter that is provided on a path connecting the common terminal Port1 to the individual terminal Port11 and has a downlink frequency band of, for example, Band 3 as a pass band.

The filter 12 is a transmission filter that is provided on a path connecting the common terminal Port1 to the individual terminal Port12 and has an uplink frequency band of, for example, Band 3 as a pass band.

The filter 21 is a reception filter that is provided on a path connecting the common terminal Port1 to the individual terminal Port21 and has a downlink frequency band of, for example, Band 1 as a pass band.

The filter 22 is a transmission filter that is provided on a path connecting the common terminal Port1 to the individual terminal Port22 and has an uplink frequency band of, for example, Band 1 as a pass band.

The individual terminal Port22 is an example of a first terminal, and the filter 22 is an example of a first filter that is provided on a first path connecting the common terminal Port1 to the individual terminal Port22 as the first terminal.

Furthermore, the individual terminal Port12 is an example of a second terminal, and the filter 12 is an example of a second filter that is provided on a second path connecting the common terminal Port1 to the individual terminal Port12 as the second terminal.

Furthermore, the individual terminal Port21 is an example of a third terminal, and the filter 21 is an example of a third filter that is provided on a third path connecting the common terminal Port1 to the individual terminal Port21 as the third terminal.

The filters 11 and 12 define a duplexer 10 that demultiplexes and multiplexes transmission signals and reception signals in Band 3. The filters 21 and 22 define a duplexer 20 that demultiplexes and multiplexes transmission signals and reception signals in Band 1.

As described above, the quadplexer 1 is configured such that a common terminal of the duplexer 10 for Band 3 and a common terminal of the duplexer 20 for Band 1 are connected to each other at a node N and then connected to the common terminal Port1.

In the quadplexer 1, an impedance element, such as, for example, an inductor to provide impedance matching may be connected on a path connecting each of the filters 11, 12, 21, and 22 to the node N or a path connecting the node N to the common terminal Port1.

Specific ranges of frequency bands allocated to Band 1 and Band 3 as pass bands of the quadplexer 1 will be explained below. Hereinafter, regarding ranges of frequency bands, a numerical range from A to B both inclusive will be simply referred to as a range from A to B.

Figure 2:
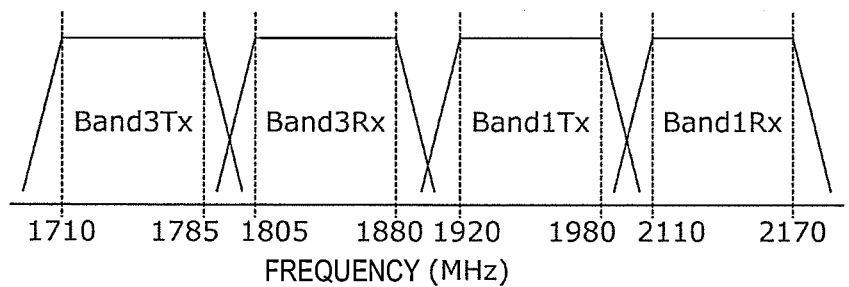
FIG. 2 is a diagram illustrating an example of pass bands of filters of a multiplexer according to a preferred embodiment of the present invention.

FIG. 2 is a diagram to explain frequency bands allocated to Band 1 and Band 3. Hereinafter, a downlink frequency band (reception band) and an uplink frequency band (transmission band) of each Band may be represented by signs each including a combination of the name of the band and letters Rx or Tx indicating the reception band or the transmission band added at the end of the name of the band, such as "Band1Rx" for the reception band of Band 1.

As illustrated in FIG. 2, for example, for Band 1, a frequency range from about 1920 MHz to about 1980 MHz is allocated to the transmission band Band1Tx, and a frequency range from about 2110 MHz to about 2170 MHz is allocated to the reception band Band1Rx. For Band 3, a frequency range from about 1710 MHz to about 1785 MHz is allocated to the transmission band Band3Tx, and a frequency range from about 1805 MHz to about 1880 MHz is allocated to the reception band Band3Rx. Thus, characteristics that transmit signals in the transmission bands or the reception bands of the corresponding Bands and attenuate signals in other bands are required as filter characteristics of the filters 11, 12, 21, and 22, as indicated by solid lines in FIG. 2.

Next, a basic configuration of the filters 11, 12, 21, and 22 will be described. Hereinafter, the filter 22 (first filter) with Band1Rx as a pass band will be described as an example. The configuration of a filter described below may be applied to the filters 11, 12, and 21.

Figure 3A:
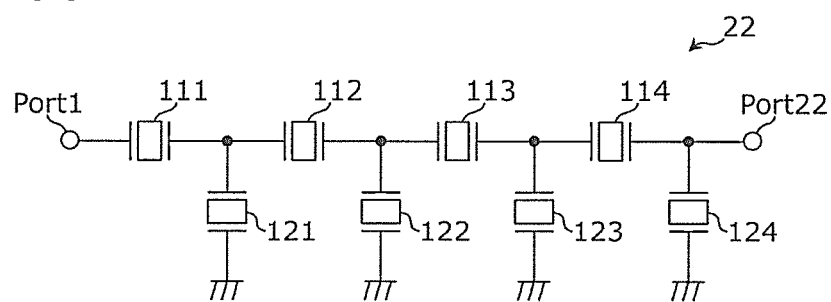
FIG. 3A is a circuit diagram illustrating an example of a basic configuration of a filter according to a preferred embodiment of the present invention.

FIG. 3A is a circuit diagram illustrating an example of the basic configuration of the filter 22. As illustrated in FIG. 3A, the filter 22 includes series resonators 111 to 114 and parallel resonators 121 to 124. The series resonators 111 to 114 and the parallel resonators 121 to 124 are, for example, surface acoustic wave (SAW) resonators.

The series resonators 111 to 114 are connected in series to one another in this order from the common terminal Port1 side on a path (series arm) connecting the common terminal Port1 to the individual terminal Port22. Furthermore, the parallel resonators 121 to 124 are connected in parallel to one another on paths (parallel arms) connecting connection points for the corresponding series resonators 111 to 114 to reference terminals (ground). Accordingly, the filter 22 is configured as a band pass filter having a four-step ladder structure.

Each of the number of series resonators and the number of parallel resonators in the filter 22 is not limited to four. The filter 22 only needs to include one or more series resonators and one or more parallel resonators. That is, the filter 22 may have a ladder structure including one or more steps.

Furthermore, the parallel resonators 121 to 124 may be connected to reference terminals (ground terminals) with inductors, which are not illustrated in the drawing, interposed therebetween. Furthermore, an impedance element, such as an inductor or a capacitor, for example, may be inserted or connected on a series arm, a parallel arm, or both the series arm and the parallel arm.

Furthermore, a parallel resonator may be connected to a node near the common terminal Port1 for the series resonator 111 that is closest to the common terminal Port1, out of the series resonators 111 to 114 of the ladder filter structure. Furthermore, the parallel resonator 124, which is connected to the node near the individual terminal Port22 for the series resonator 114, which is closest to the individual terminal Port22, may be omitted.

Furthermore, the filter 22 is not limited to the ladder filter illustrated in FIG. 3A. The filter 22 may be, for example, a longitudinally coupled filter.

Figure 3B:
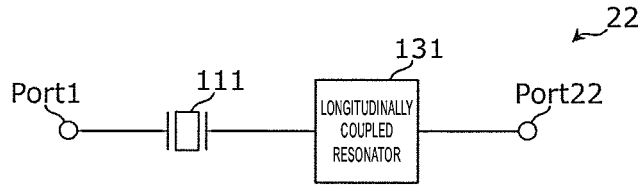
FIG. 3B is a circuit diagram illustrating another example of a basic configuration of a filter according to a preferred embodiment of the present invention.

FIG. 3B is a circuit diagram illustrating an example of a longitudinally coupled filter, as another example of the basic configuration of the filter 22. As illustrated in FIG. 3B, the filter 22 may include the series resonator 111 and a longitudinally coupled resonator 131. The series resonator 111 and the longitudinally coupled resonator 131 are arranged in this order from a side closer to the common terminal Port1 on a signal path connecting the common terminal Port1 to the individual terminal Port22. Furthermore, the filter 22 may have a configuration including a parallel resonator and a longitudinally coupled resonator.

Next, a basic structure of a surface acoustic wave resonator used as a resonator of the filter 22 will be described.

Figure 4A:
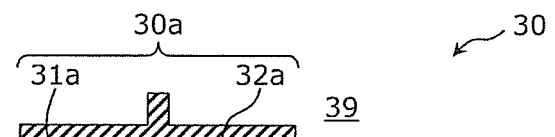
FIGS. 4A and 4B include schematic diagrams illustrating an example of a basic structure of a surface acoustic wave resonator according to a preferred embodiment of the present invention.
Figure 4B:
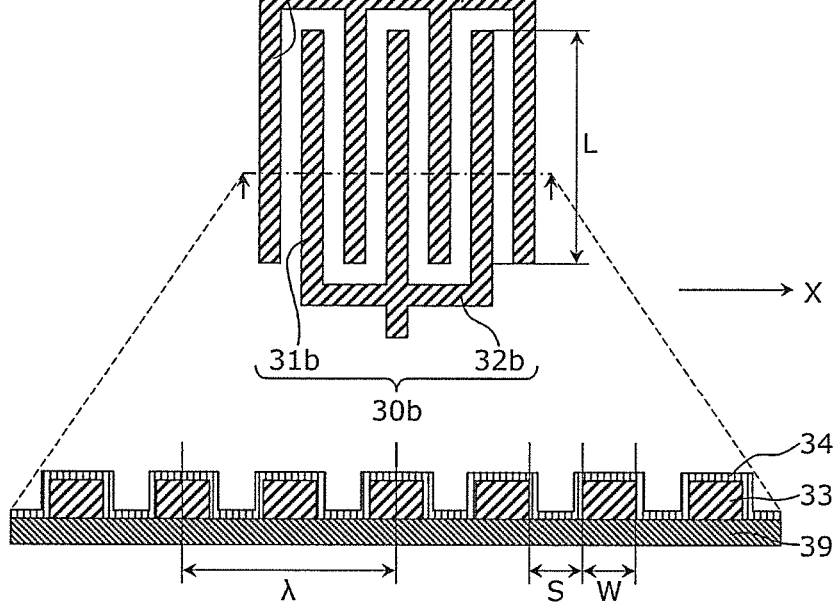

FIGS. 4A and 4B include schematic diagrams illustrating an example of the basic structure of a surface acoustic wave resonator. FIG. 4A is a plan view, and FIG. 4B is a section view. FIG. 4B corresponds to a cross section on a one-dot chain line illustrated in FIG. 4A. The structure of a resonator 30 illustrated in FIGS. 4A and 4B is also applied to, for example, the series resonators 111 to 114, the parallel resonators 121 to 124, and the longitudinally coupled resonator 131 of the filter 22 and resonators of the filters 11, 12, and 21. The illustrations of FIGS. 4A and 4B are provided to explain the basic structure of a surface acoustic wave resonator. The number and length of electrode fingers of an electrode are not limited to those illustrated in FIGS. 4A and 4B.

The resonator 30 is configured such that an IDT electrode is provided on a piezoelectric layer 39 and covered with a protection layer 34. For example, the piezoelectric layer 39 may be made of a piezoelectric material including lithium tantalate or lithium niobate, and the IDT electrode 33 may be made of metal such as, for example, copper or aluminum or an alloy of such metals. The protection layer 34 may be made of a protection material including, for example, silicon dioxide as a main component. The piezoelectric layer 39 may be provided on a supporting substrate made of, for example, a silicon substrate. The piezoelectric layer 39 itself may be a supporting substrate.

The IDT electrode 33 includes a pair of comb-shaped electrodes 30a and 30b that face each other. The comb-shaped electrode 30a includes a plurality of electrode fingers 31a that are parallel or substantially parallel to one another and a busbar electrode 32a that connects the plurality of electrode fingers 31a. The comb-shaped electrode 30b includes a plurality of electrode fingers 31b that are parallel or substantially parallel to one another and a busbar electrode 32b that connects the plurality of electrode fingers 31b. The electrode fingers 31a and 31b extend along a direction orthogonal or substantially orthogonal to an X-axis direction. Acoustic waves excited at the IDT electrode 33 propagate in the X-axis direction in the piezoelectric layer 39.

Parameters that define the shape and size of the IDT electrode 33 are referred to as electrode parameters.

Examples of the electrode parameters include a wavelength λ, which is a repetition period in an acoustic wave propagation direction of the electrode fingers 31a or 31b, an intersecting width L, which is the overlapping length of the electrode fingers 31a and 31b when viewed in the acoustic wave propagation direction, the line width W of the electrode fingers 31a and 31b, and the space width S between the adjacent electrode fingers 31a and 31b.

The number N of pairs, which is half the total number of electrode fingers of the electrode fingers 31a and 31b, the electrode pitch (W+S), which is a repetition period of the total electrode fingers of the electrode fingers 31a and 31b, and the duty W/(W+S), which is the ratio of the line width W in the electrode pitch, are also examples of the electrode parameters.

For example, of the plurality of acoustic wave resonators provided in the filter 22, the series resonator 111, which is closest to the common terminal Port1, includes an IDT electrode and a piezoelectric substrate. The series resonator 111 also includes a dielectric film between the IDT electrode and the piezoelectric substrate. Furthermore, at least one of the plurality of acoustic wave resonators includes an IDT electrode and a piezoelectric substrate. The at least one of the plurality of acoustic wave resonators also includes a dielectric film between the IDT electrode and the piezoelectric substrate. The thickness of the dielectric film provided in the series resonator 111 that is closest to the common terminal Port1 is greater than the thickness of the dielectric film provided in the at least one of the plurality of acoustic wave resonators.

Next, IMD that occurs in a multiplexer will be described with reference to the example of the configuration of the quadplexer 1 illustrated in FIG. 1 and the example of the frequency bands illustrated in FIG. 2.

Figure 5A:
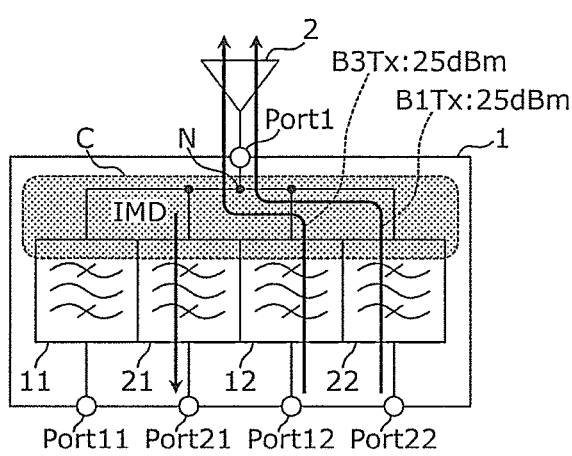
FIG. 5A is a schematic diagram illustrating an example of IMD that occurs in a multiplexer according to a preferred embodiment of the present invention.

FIG. 5A illustrates an example of IMD that occurs in the quadplexer 1 in the case where a transmission signal B1Tx of Band 1 and a transmission signal B3Tx of Band 3 are transmitted at the same time from a single antenna element 2 via the quadplexer 1.

Figure 5B:
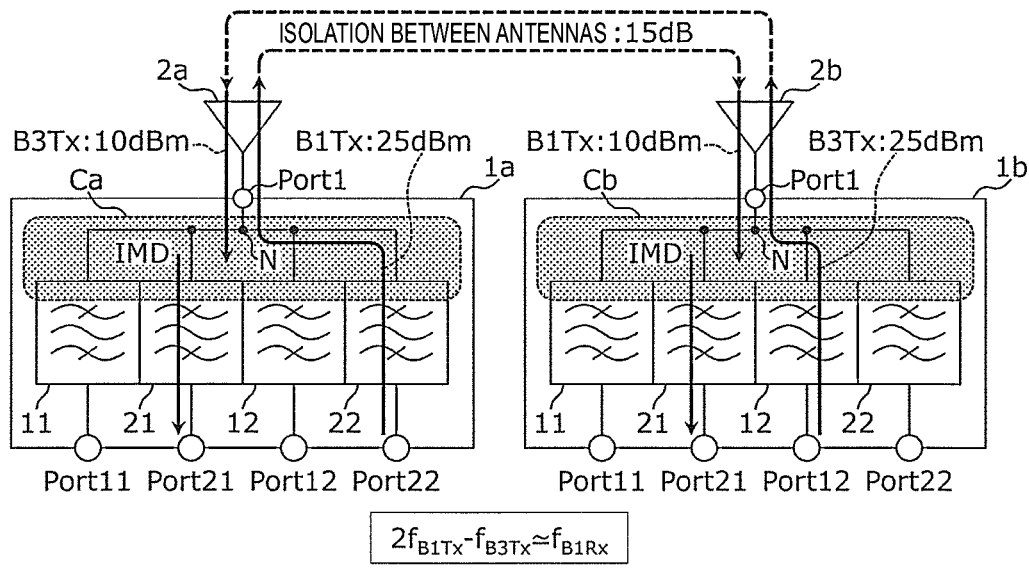
FIG. 5B is a schematic diagram illustrating another example of IMD that occurs in a multiplexer according to a preferred embodiment of the present invention.

FIG. 5B illustrates an example of IMD that occurs in quadplexers 1a and 1b in the case where a transmission signal of Band 1 and a transmission signal of Band 3 are transmitted at the same time from antenna elements 2a and 2b via the quadplexers 1a and 1b. The quadplexers 1a and 1b each have the same or substantially the same configuration as the quadplexer 1.

In each of FIGS. 5A and 5B, transmission signals B1Tx and B3Tx of the same or substantially the same strength as that for actual transmission are concentrated in circuit portions C, Ca, and Cb (indicated by hatching) of the quadplexers 1, 1a, and 1b, respectively, directly or by coupling between the antenna elements 2a and 2b. Thus, IMD of the transmission signals B1Tx and B3Tx is likely to occur in the circuit parts C, Ca, and Cb.

For example, a frequency 2fB1Tx−fB3Tx, which is obtained by subtracting the frequency fB3Tx of the transmission signal B3Tx from a frequency twice the frequency fB1Tx of the transmission signal B1Tx, overlaps with the frequency fB1Rx of the reception signal B1Rx of Band 1. When IMD, which is due to the transmission signals B1Tx and B3Tx, occurs in the Band1Rx, the reception signal B1Rx is interfered by the IMD, and the reception sensitivity in Band 1 is thus reduced.

A nonlinear element that easily causes IMD in the circuit portions C, Ca, Cb is, for example, a resonator that is closest to the common terminal Port1 of the resonators of the filter 22. In the example of FIGS. 3A and 3B, the series resonator 111 is directly connected to the common terminal Port1 and is therefore the resonator that is closest to the common terminal Port1 among the series resonators 111 to 114 and the parallel resonators 121 to 124 of the filter 22.

Electric power of a plurality of signals (for example, electric power of the transmission signals B1Tx and B3Tx) is likely to be concentrated in the resonator closest to the common terminal Port1. Accordingly, when electric power large enough to generate a nonlinear response is concentrated in the resonator, IMD occurs.

Thus, in the present preferred embodiment, the resonator closest to the common terminal Port1 in the filter 22 has a structure that causes power consumption per unit area in the piezoelectric substrate (hereinafter, simply referred to as power consumption) to be less likely to be large compared to other resonators. As illustrated in FIG. 3A, in the case where an element that is closest to the common terminal Port1 on the first path is a series resonator, the series resonator is the closest resonator to the common terminal Port1. However, in the case where an element that is closest to the common terminal Port1 on the first path is a node, two resonators, that is, a parallel resonator that is connected on a path connecting the node to the ground and a series resonator that is directly connected to the node are the closest resonators to the common terminal Port1. In this case, the structure that causes power consumption to be less likely to be large is applied to at least one of the parallel resonator and the series resonator.

Furthermore, as illustrated in FIG. 3B, in the case of a longitudinally coupled filter, the structure that causes power consumption to be less likely to be large is applied to a resonator closest to the common terminal Port1.

Figure 6:
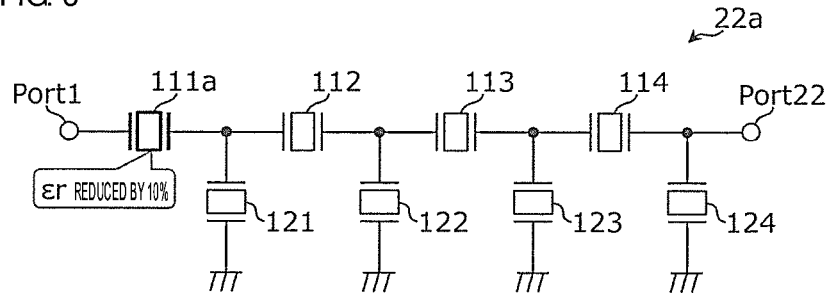
FIG. 6 is a circuit diagram illustrating an example of the configuration of a filter according to a first preferred embodiment of the present invention.

FIG. 6 is a circuit diagram illustrating an example of the configuration of a filter according to a preferred embodiment of the present invention. As illustrated in FIG. 6, a filter 22a is different from the filter 22 in FIGS. 3A and 3B in that the relative permittivity of a series resonator 111a is lower than the relative permittivity of the series resonator 111 (for example, reduced by 10%). Herein, the relative permittivity of a resonator represents a parameter that is proportional to the capacitance of a resonator of the same size.

The capacitance of a resonator decreases as the relative permittivity of the resonator decreases. Such a variation in the capacitance of a resonator can be canceled out, for example, by increasing the size of the resonator. Thus, in the case where the relative permittivity of a resonator is reduced and the size of the resonator is increased so that a variation in the capacitance can be canceled out, the area of the resonator in the piezoelectric substrate increases and the power consumption per unit area decreases. Therefore, IMD that occurs in the resonator is reduced. Increasing the size of a resonator includes, for example, at least one of increasing the number N of pairs of IDT electrodes and increasing the intersecting width L of the IDT electrodes.

In the example of the filter 22a, the relative permittivity of the series resonator 111a is lowest among the relative permittivities of the resonators. Compared to the other resonators with higher relative permittivities, the area of the series resonator 111a in the piezoelectric substrate increases so that a capacitance obtained with optimal design can be achieved, and the power consumption per unit area decreases. Therefore, IMD in the series resonator 111a is reduced. Furthermore, the relative permittivity of the series resonator 111a, which is closest to the common terminal Port1 and in which electric power of signals is thus most likely to be concentrated, is set to be low. Thus, while there is a disadvantage that the size of the resonator increases, the advantageous effects of reducing IMD can be improved or maximized.

In the example explained above, in the filter 22, the relative permittivity of the resonator closest to the common terminal Port1 is set to be lowest among the relative permittivities of the resonators. However, the present invention is not limited to this example. A similar configuration may be applied to the filter 12 or may be applied to both of the filters 22 and 12.

Next, advantageous effects of reducing IMD in the case where the filter 22a is used in place of the filter 22 in the quadplexer 1 will be explained based on results of a simulation.

In the simulation, IMD in the quadplexer 1a (FIG. 5B) and IMD in a quadplexer (not illustrated in a drawing) in which the filter 22 (see FIGS. 3A and 3B) of the quadplexer 1a is replaced with the filter 22a (FIG. 6) are compared with each other. Hereinafter, the quadplexer 1a including the filter 22 and the quadplexer including 22a will be referred to as a comparative example and an example of a preferred embodiment of the present invention, respectively.

In the comparative example, the relative permittivities of all of the resonators of the filter 22 are the same. In the example, the relative permittivity of the series resonator 111a, of the resonators of the filter 22a, is lower than the relative permittivities of the resonators by about ten percent, for example, and the size of the series resonator 111a is increased so that a reduction in the capacitance as a result of the reduction in the relative permittivity can be compensated for.

For the comparative example and the example, the strength of IMD in the reception band (for example, about 2110 MHz to about 2170 MHz) of Band 1 at the individual terminal Port21 was calculated. In a calculation of the strength of IMD, assuming application to the quadplexer 1a in the configuration in FIG. 5B, the signal strengths of transmission signals of Band 1 and Band 3 at output ends of the filters 22 and 12 are set to, for example, about 25 dBm and about 10 dBm, respectively.

Figure 7:
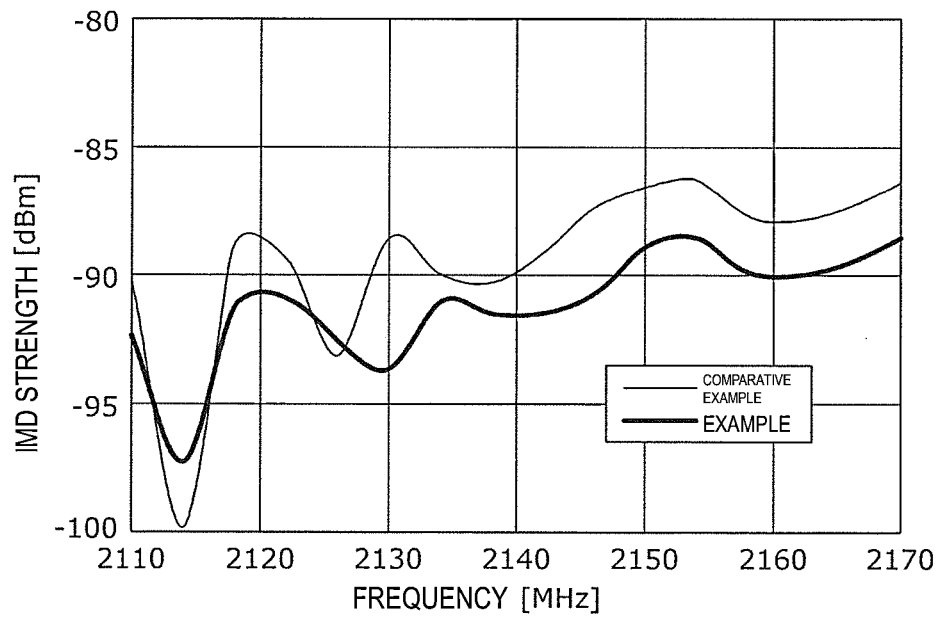
FIG. 7 is a graph illustrating an example of a calculation of the strength of IMD that occurs in a multiplexer including a filter according to a preferred embodiment of the present invention and the strength of IMD that occurs in a multiplexer including a filter according to a comparative example.

FIG. 7 is a graph illustrating an example of a calculation of the strength of IMD. As seen in FIG. 7, the strength of IMD is reduced (improved) in most portions of the reception band of Band 1 in the example, compared to the strength of IMD in the comparative example.

Based on this result, it is confirmed that making the relative permittivity of a resonator that is closest to the common terminal, IMD being likely to occur in the resonator because electric power of a signal is likely to be concentrated in the resonator, lower than the relative permittivity of the other resonators, is effective to reduce IMD.

In the simulation described above, a structure to reduce the relative permittivity of a resonator is not particularly limited. However, for example, the relative permittivity of a surface acoustic wave resonator may be reduced by providing an adjustment layer between an IDT electrode and a substrate.

Figure 8:
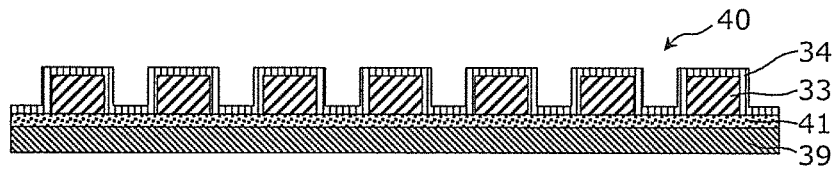
FIG. 8 is a schematic diagram illustrating an example of the structure of a surface acoustic wave resonator according to the first preferred embodiment of the present invention.

FIG. 8 is a schematic diagram illustrating an example of the structure of a surface acoustic wave resonator according to a preferred embodiment of the present invention. As illustrated in FIG. 8, a resonator 40 is different from the resonator 30 in FIGS. 4A and 4B in that an adjustment layer 41 is provided between the IDT electrode 33 and the piezoelectric layer 39. The adjustment layer 41 is, for example, a dielectric film made of silicon dioxide or the like.

A surface acoustic wave resonator (comparative example) not including the adjustment layer 41 and a surface acoustic wave resonator (example of a preferred embodiment of the present invention) including the adjustment layer 41 were manufactured as trial products in accordance with the configurations of the resonators 30 and 40, and IMD in each of the surface acoustic wave resonators was measured. In the surface acoustic wave resonator according to the example, the adjustment layer 41 is made of silicon dioxide with a thickness of about 10 nm, for example.

Table 1 indicates conditions for measurement. As indicated in Table 1, a measurement circuit is a single surface acoustic wave resonator. The strength of IMD of frequency 2f1-f2, which is generated when a signal Tx1 of frequency f1 and a signal Tx2 of frequency f2 are input to a surface acoustic wave resonator according to each of the comparative example and the example, was measured. Strengths and frequencies of the signals Tx1 and Tx2 are indicated in Table 1.

TABLE 1

| Measurement circuit | Signal | Strength (dBm) | Frequency | Lower limit (MHz) | Upper limit (MHz) |
|---|---|---|---|---|---|
| Tx1 →<br>⊣☐⊢ → IMD<br>Tx2 → | Tx1<br>Tx2<br>IMD | 15<br>15<br>Measured value | f1<br>f2<br>2f1 − f2 | 1850<br>1770<br>1930 | 1915<br>1835<br>1995 |

Figure 9:
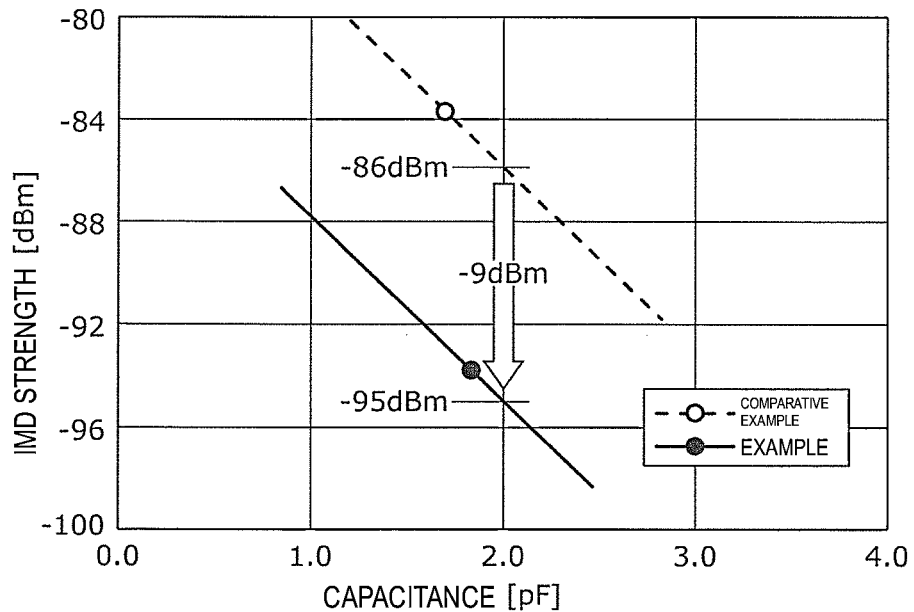
FIG. 9 is a graph illustrating an example of a measurement of the strength of IMD in a surface acoustic wave resonator according to a preferred embodiment of the present invention and the strength of IMD in a surface acoustic wave resonator according to a comparative example.

FIG. 9 is a graph illustrating an example of a measurement of the strength of IMD in each of the comparative example and the example. In FIG. 9, for each of the comparative example and the example, a plot indicates a measured value of the strength of IMD, and a straight line passing through the plot indicates a predicted value of the strength of IMD corresponding to a capacitance value (correlated with the size of a resonator). For example, regarding the strength of IMD in a surface acoustic wave resonator with a capacitance of about 2.0 pF, a predicted value for the comparative example (not including an adjustment layer) is about −86 dBm, and a predicted value for the example (including an adjustment layer) is about −95 dBm. In the example, the relative permittivity is low, and the predicted value is improved by about 9 dBm, compared to the comparative example.

Figure 10A:
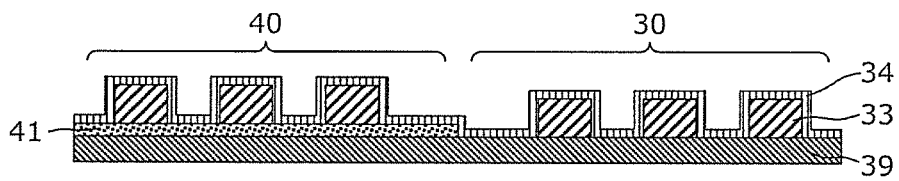
FIG. 10A is a schematic diagram illustrating an example of the structure of surface acoustic wave resonators provided in a filter according to the first preferred embodiment of the present invention.

Thus, for example, as illustrated in FIG. 10A, for resonators of the filter 22a, the resonator 40, which includes the adjustment layer 41, is used as the series resonator 111a, and the resonator 30, which does not include the adjustment layer 41, is used as the other resonators. Accordingly, the filter 22a with less IMD can be obtained.

A configuration for making the relative permittivity of the series resonator 111a lower than the relative permittivities of the other resonators is not limited to the example illustrated in FIG. 10A.

Figure 10B:
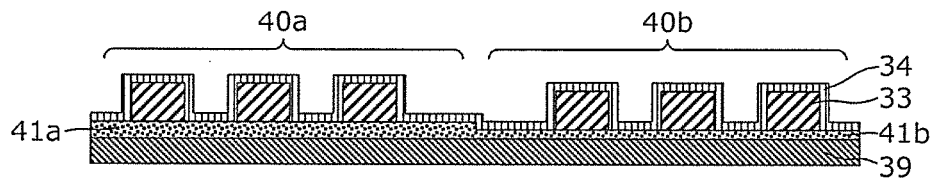
FIG. 10B is a schematic diagram illustrating another example of the structure of surface acoustic wave resonators provided in a filter according to the first preferred embodiment of the present invention.

For example, as illustrated in FIG. 10B, a resonator 40a including a thick adjustment layer 41a may be used as the series resonator 111a, and a resonator 40b including an adjustment layer 41b that is thinner than the adjustment layer 41a may be used as the other resonators.

Figure 10C:
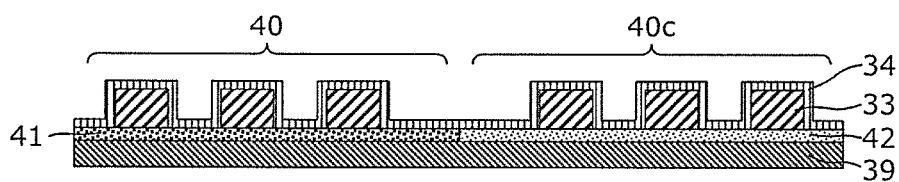
FIG. 10C is a schematic diagram illustrating still another example of the structure of surface acoustic wave resonators provided in a filter according to the first preferred embodiment of the present invention.

Furthermore, as illustrated in FIG. 10C, the resonator 40 including the adjustment layer 41 may be used as the series resonator 111a, and a resonator 40c including an adjustment layer 42 that is made of a material different from the material of the adjustment layer 41 and that reduces the relative permittivity to an extent less than that reduced by the adjustment layer 41 may be used as the other resonators.

Furthermore, although not illustrated in drawings, the series resonator 111a and the other resonators may be provided on different substrates made of materials with different relative permittivities.

Figure 10D:
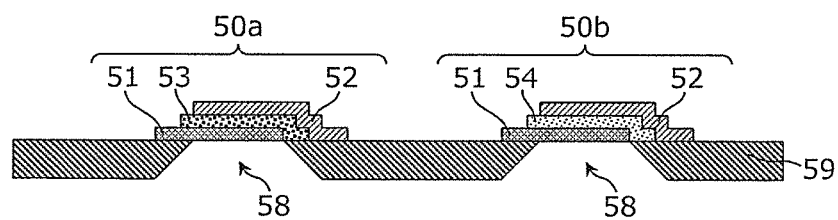
FIG. 10D is a schematic diagram illustrating an example of the structure of bulk acoustic wave resonators provided in a filter according to the first preferred embodiment of the present invention.

A configuration for making the relative permittivity of the series resonator 111a lower than the relative permittivities of the other resonators is not limited to a surface acoustic wave resonator. Such configuration may also be applied to a filter including a bulk acoustic wave resonator, for example. As illustrated in FIG. 10D, resonators 50a and 50b are bulk acoustic wave resonators in which piezoelectric films 53 and 54 are sandwiched between electrodes 51 and 52. The resonators 50a and 50b are provided on cavities 58 of a substrate 59.

The relative permittivities of the resonators 50a and 50b are adjusted by impurity doped into the piezoelectric films 53 and 54, respectively. Impurity is not particularly limited. However, for example, by scandium doped into the piezoelectric films 53 and 54, the relative permittivities of the resonators 50a and 50b are increased.

Thus, impurity (for example, scandium) is doped into the piezoelectric film 54, and no impurity is doped into the piezoelectric film 53 or impurity with a concentration lower than the impurity doped into the piezoelectric film 54 is doped into the piezoelectric film 53. On the other hand, for the case where impurity to reduce the relative permittivities of the resonators 50a and 50b is used, impurity is doped into the piezoelectric film 53, and no impurity is doped into the piezoelectric film 54 or impurity with a concentration lower than the impurity doped into the piezoelectric film 53 is doped into the piezoelectric film 54.

With the resonators 50a and 50b configured as described above, the resonator 50a is used as the series resonator 111a, and the resonator 50b is used as the other resonators. Accordingly, a filter with less IMD can be obtained.

Advantageous effects of making the relative permittivity of the resonator closest to the common terminal Port1 in a filter lowest among the relative permittivities of the resonators has been described above referring to an application example of a quadplexer. However, such advantageous effects are not limited to the example explained above. Similar advantageous effects can also be achieved with a duplexer or a diplexer, which is a multiplexer including two filters.

For example, in a multiplexer that includes a first filter on a first path connecting a common terminal to a first terminal and a second filter on a second path connecting the common terminal to a second terminal, the first filter includes a plurality of acoustic wave resonators. In the multiplexer, in a case where the frequency of intermodulation distortion caused by a first signal of a frequency within a pass band of the first filter and a second signal of a frequency within a pass band of the second filter is within the pass band of the second filter, the first filter is configured such that the relative permittivity of the resonator closest to the common terminal is lowest among the relative permittivities of the resonators.

Accordingly, in a similar manner to an application example of a quadplexer, the relative permittivity of the resonator closest to the common terminal, that is, the resonator in which IMD is most likely to occur because electric power of a signal is most likely to be concentrated in the resonator, of resonators forming the first filter, is set to be lowest among the relative permittivities of the resonators.

Therefore, the area of the resonator in the piezoelectric substrate increases so that a capacitance obtained with optimal design can be achieved, and the power consumption per unit area decreases. Therefore, IMD that occurs in the resonator is reduced. The relative permittivity of the resonator in which electric power of a signal is most likely to be concentrated is set to be low. Thus, while there is a disadvantage that the size of the resonator increases, the advantageous effects of reducing IMD can be improved or maximized.

Second Preferred Embodiment

A multiplexer to which a filter according to a second preferred embodiment of the present invention is applied will be described referring to a multiplexer including a band pass filter and a notch filter as an example.

Figure 11:
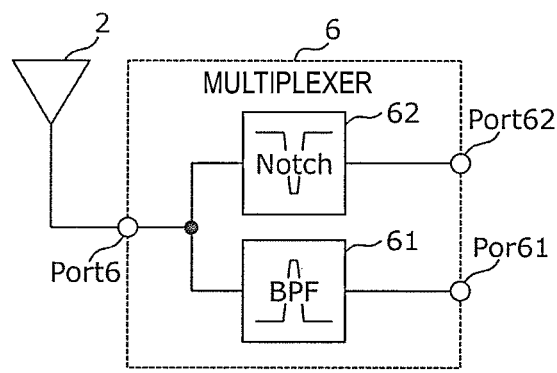
FIG. 11 is a block diagram illustrating an example of the configuration of a multiplexer according to a second preferred embodiment of the present invention.

FIG. 11 is a block diagram illustrating an example of the configuration of a multiplexer according to the second preferred embodiment of the present invention. As illustrated in FIG. 11, a multiplexer 6 includes a common terminal Port6, two individual terminals Port61 and Port62, and two filters 61 and 62.

The common terminal Port6 is provided in common for the two filters 61 and 62 and is connected to the filters 61 and 62 inside the multiplexer 6. Furthermore, the common terminal Port6 is connected to an antenna element 2 outside the multiplexer 6. That is, the common terminal Port6 also defines and functions as an antenna terminal of the multiplexer 6.

The filter 61 is a band pass filter that is on a path connecting the common terminal Port6 to the individual terminal Port61 and has a frequency band, for example, used for WiFi® as a pass band.

The filter 62 is a notch filter that is on a path connecting the common terminal Port6 to the individual terminal Port62 and has a frequency band, for example, used for WiFi as a stop band. The filter 62 has a pass band corresponding to, for example, a range from Band 3 to Band 40 on a lower frequency side of the stop band and a pass band corresponding to Band 7/Band 41 on a higher frequency side of the stop band.

The individual terminal Port61 is an example of a first terminal, and the filter 61 is an example of a first filter that is on a first path connecting the common terminal Port6 to the individual terminal Port61 as the first terminal.

Furthermore, the individual terminal Port62 is an example of a second terminal, and the filter 62 is an example of a second filter that is on a second path connecting the common terminal Port6 to the individual terminal Port62 as the second terminal.

Specific ranges of frequency bands allocated to pass bands of the multiplexer 6 will be explained. Hereinafter, regarding ranges of frequency bands, a numerical range from A to B both inclusive will be simply referred to as a range from A to B.

Figure 12:
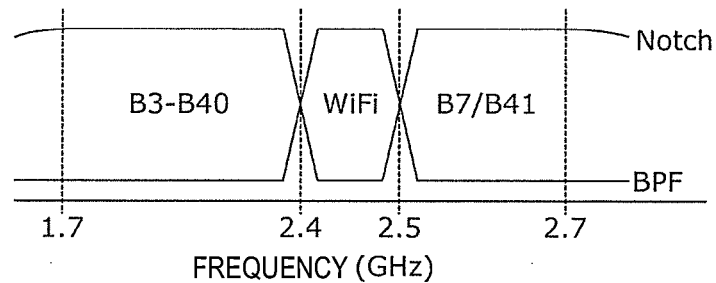
FIG. 12 is a diagram illustrating an example of pass bands of filters according to the second preferred embodiment of the present invention.

FIG. 12 is a diagram to explain frequency bands allocated to a range from Band 3 to Band 40, WiFi, and Band 7/Band 41. Hereinafter, a downlink frequency band (reception band) and an uplink frequency band (transmission band) of each Band may be represented by signs each including a combination of the name of the band and letters Rx or Tx indicating the reception band or the transmission band added at the end of the name of the band, such as "Band7Rx" for the reception band of Band 7.

As illustrated in FIG. 12, for example, a frequency range from about 1.7 GHz to about 2.4 GHz is allocated to a range from Band 3 to Band 40. A frequency range from about 2.4 GHz to about 2.5 GHz is allocated to WiFi. A frequency range from about 2.5 GHz to about 2.7 GHz is allocated to Band 7/Band 41. Thus, characteristics that transmit signals in the transmission bands or the reception bands of the corresponding Bands and attenuate signals in other bands are required as filter characteristics of the filters 61 and 62, as indicated by solid lines in FIG. 12.

IMD that occurs in the multiplexer 6 will be explained based on the configuration example in FIG. 11 and the frequency band example in FIG. 12.

Figure 13A:
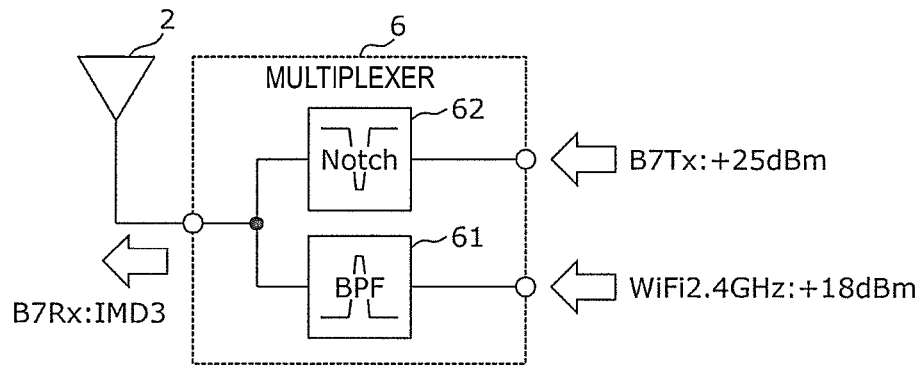
FIGS. 13A to 13C include schematic diagrams illustrating examples of IMD that occurs in a multiplexer according to the second preferred embodiment of the present invention.

FIG. 13A illustrates an example in which IMD occurs in a reception band B7Rx of Band 7 in the multiplexer 6 in the case where a signal of a transmission band B7Tx of Band 7 and a signal of a WiFi band are transmitted at the same time from the antenna element 2 via the multiplexer 6.

Furthermore, with a concept the same as or similar to the configuration explained above with reference to FIG. 5B, signals of a transmission band B41Tx of Band 41 may be transmitted at the same time from two pairs of the multiplexer 6 and the antenna element 2. In this case, due to the signal of the transmission band B41Tx of Band 41 transmitted from one of the multiplexers 6 and a signal applied from the other one of the multiplexers 6 via coupling between the antenna elements 2, IMD occurs in the one of the multiplexers 6.

Figure 13B:
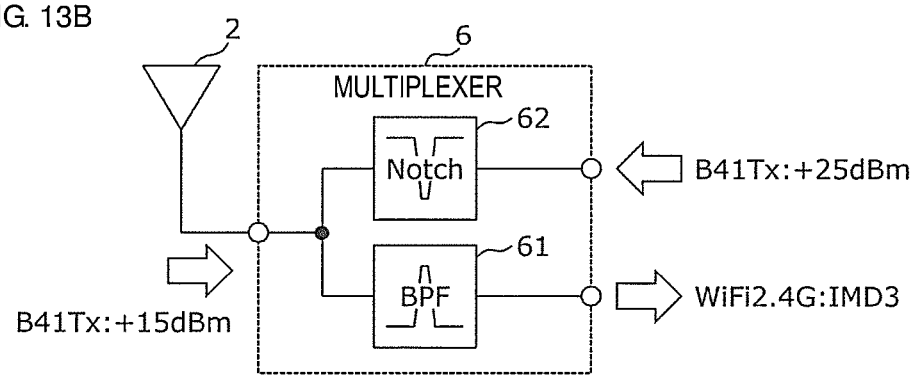
Figure 13C:
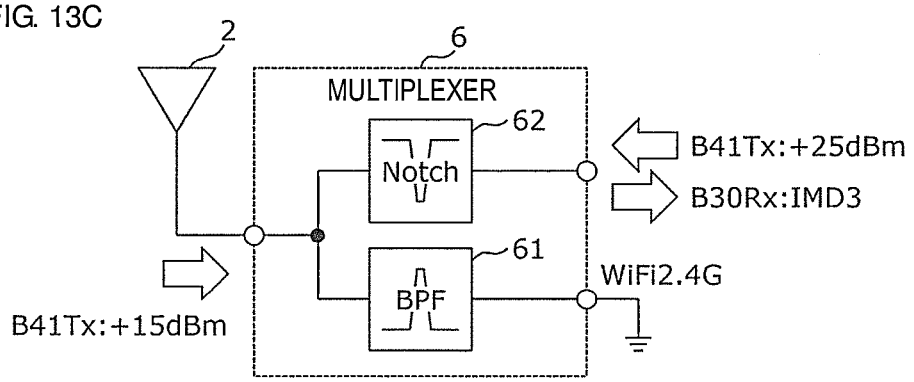

FIGS. 13B and 13C illustrate examples in which IMD occurs in a WiFi band and a reception band B30Rx of Band 30, respectively, in the one of the multiplexers.

As described above, in the multiplexer 6 including two filters, degradation in characteristics may be caused by IMD. Thus, in at least one of or both the filters 61 and 62, the relative permittivity of the resonator closest to the common terminal Port1 is set to be lowest among the relative permittivities of the resonators. Therefore, IMD that occurs in at least one of or both the filters 61 and 62 can be reduced, and the multiplexer 6 with excellent characteristics can be obtained.

A multiplexer according to a preferred embodiment of the present invention includes a first filter on a first path connecting a common terminal to a first terminal and a second filter on a second path connecting the common terminal to a second terminal. A frequency of intermodulation distortion generated by a first signal of a frequency within a pass band of the first filter and a second signal of a frequency within a pass band of the second filter is within the pass band of the second filter. At least one of the first filter and the second filter includes a plurality of acoustic wave resonators. A relative permittivity of an acoustic wave resonator of the plurality of acoustic wave resonators that is closest to the common terminal is lowest among relative permittivities of the plurality of acoustic wave resonators.

Furthermore, a multiplexer according to a preferred embodiment of the present invention includes a first filter on a first path connecting a common terminal to a first terminal, a second filter on a second path connecting the common terminal to a second terminal, and a third filter on a third path connecting the common terminal to a third terminal. A frequency of intermodulation distortion generated by a first signal of a frequency within a pass band of the first filter and a second signal of a frequency within a pass band of the second filter is within a pass band of the third filter. At least one of the first filter and the second filter includes a plurality of acoustic wave resonators. A relative permittivity of an acoustic wave resonator of the plurality of acoustic wave resonators that is closest to the common terminal is lowest among relative permittivities of the plurality of acoustic wave resonators.

With the configuration described above, the relative permittivity of the resonator that is closest to the common terminal, that is, the resonator in which IMD is most likely to occur because electric power of a signal is most likely to be concentrated in the resonator, of resonators of at least one of the first filter and the second filter, is set to be lowest among relative permittivities of the resonators. Therefore, the area of the resonator in a piezoelectric substrate increases so that a capacitance obtained with optimal design can be achieved, and power consumption per unit area decreases. Therefore, IMD that occurs in the resonator is reduced. The relative permittivity of the resonator in which electric power of a signal is most likely to be concentrated is set to be low. Thus, while there is a disadvantage that the size of the resonator increases, the advantageous effects of reducing IMD can be improved or maximized.

Furthermore, the other one of the first filter and the second filter may include a plurality of acoustic wave resonators. In the other one of the first filter and the second filter, a relative permittivity of an acoustic wave resonator of the plurality of acoustic wave resonators that is closest to the common terminal may be lowest among relative permittivities of the plurality of acoustic wave resonators.

With the configuration described above, advantageous effects the same as or similar to the advantageous effects of reducing IMD, which have been explained above for the at least one of the first filter and the second filter, may also be achieved in the other one of the first filter and the second filter.

Furthermore, the resonator closest to the common terminal may include an IDT electrode and a piezoelectric substrate. The resonator closest to the common terminal may further include a dielectric film between the IDT electrode and the piezoelectric substrate. Furthermore, at least one of the plurality of acoustic wave resonators may include an IDT electrode and a piezoelectric substrate. The at least one of the plurality of acoustic wave resonators may further include a dielectric film between the IDT electrode and the piezoelectric substrate. A film thickness of the dielectric film provided in the resonator closest to the common terminal may be greater than a film thickness of the dielectric film provided in the at least one of the plurality of acoustic wave resonators.

Furthermore, the first filter may include a plurality of acoustic wave resonators. The plurality of acoustic wave resonators provided in the first filter may be one or more series resonators on the first path and one or more parallel resonators on one or more paths connecting one or more nodes on the first path to a ground.

Furthermore, the first filter may include a plurality of acoustic wave resonators. The plurality of acoustic wave resonators provided in the first filter may be a series resonator and a longitudinally coupled resonator that are provided in this order from a side closer to the common terminal on the first path.

Furthermore, the second filter may include a plurality of acoustic wave resonators. The plurality of acoustic wave resonators provided in the second filter may be one or more series resonators on the second path and one or more parallel resonators on one or more paths connecting one or more nodes on the second path to a ground.

Furthermore, the second filter may include a plurality of acoustic wave resonators. The plurality of acoustic wave resonators provided in the second filter may be a series resonator and a longitudinally coupled resonator that are provided in this order from a side closer to the common terminal on the second path.

With the configuration described above, the first filter or both the first filter and the second filter are configured as a ladder filter circuit or a filter circuit including a longitudinally coupled resonator. Thus, excellent effects of reducing IMD can be achieved.

Furthermore, a pass band of one of the first filter and the second filter may be equal to or more than about 1920 MHz and less than or equal to about 1980 MHz, a pass band of the other one of the first filter and the second filter may be equal to or more than about 1710 MHz and less than or equal to about 1785 MHz, and a pass band of the third filter may be equal to or more than about 2110 MHz and less than or equal to about 2200 MHz.

With the configuration described above, the pass band of the first filter and the pass band of the second filter may be one and the other one of a transmission band Band1Tx of Band 1 and a transmission band Band3Tx of Band 3. Furthermore, the pass band of the third filter is a reception band Band1Rx of Band 1. That is, the first filter and the second filter are used as one and the other one of a transmission filter of Band 1 and a transmission filter of Band 3, and the third filter is used as a reception filter of Band 1.

A frequency obtained by subtracting a frequency of a transmission signal of Band 3 from a frequency twice a frequency of a transmission signal of Band 1 overlaps with a frequency of a reception signal of Band 1. Therefore, when the transmission signal of Band 1 and the transmission signal of Band 3 are transmitted at the same time, the transmission signal of Band 1 and the transmission signal of Band 3 are interfering waves to each other, and IMD at a high level occurs within the reception band Band1Rx of Band 1. Thus, a filter for which countermeasures to reduce IMD have been taken is used as the first filter or both the first filter and the second filter. Therefore, IMD that occurs in the reception band Band1Rx of Band 1 can be reduced. For example, degradation in the reception sensitivity of Band 1 can be reduced.

Multiplexers according to preferred embodiments of the present invention have been described above. However, the present invention is not limited to each of the preferred embodiments described above. Modifications obtained by making various changes conceived by those skilled in the art to the preferred embodiments and configurations obtained by combining components in different preferred embodiments may also be encompassed in other preferred embodiments of the present invention, without departing from the scope of the present invention.

Preferred embodiments of the present invention may be widely used as multiplexers for communication equipment, such as a mobile phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a first filter on a first path connecting a common terminal to a first terminal; and
a second filter on a second path connecting the common terminal to a second terminal; wherein
a frequency of intermodulation distortion generated by a first signal of a frequency within a pass band of the first filter and a second signal of a frequency within a pass band of the second filter is within the pass band of the second filter;
at least one of the first filter and the second filter includes a plurality of acoustic wave resonators; and
a relative permittivity of an acoustic wave resonator of the plurality of acoustic wave resonators that is closest to the common terminal is lowest among relative permittivities of the plurality of acoustic wave resonators.

2. The multiplexer according to claim 1, wherein
another one of the first filter and the second filter includes a plurality of acoustic wave resonators; and
in the another one of the first filter and the second filter, a relative permittivity of an acoustic resonator of the plurality of acoustic wave resonators that is closest to the common terminal is lowest among relative permittivities of the plurality of acoustic wave resonators.

3. The multiplexer according to claim 2, wherein
the second filter includes the plurality of acoustic wave resonators; and
the plurality of acoustic wave resonators provided in the second filter include one or more series resonators on the second path and one or more parallel resonators on one or more paths connecting one or more nodes on the second path to a ground.

4. The multiplexer according to claim 2, wherein
the second filter includes the plurality of acoustic wave resonators; and
the plurality of acoustic wave resonators provided in the second filter include a series resonator and a longitudinally coupled resonator provided in this order from a side closer to the common terminal on the second path.

5. The multiplexer according to claim 1, wherein
the acoustic wave resonator closest to the common terminal includes an IDT electrode, a piezoelectric substrate, and a dielectric film between the IDT electrode and the piezoelectric substrate.

6. The multiplexer according to claim 5, wherein
at least one of the plurality of acoustic wave resonators other than the acoustic wave resonator closest to the common terminal includes an IDT electrode, a piezoelectric substrate, and a dielectric film between the IDT electrode and the piezoelectric substrate;
and a film thickness of the dielectric film in the acoustic wave resonator closest to the common terminal is greater than a film thickness of the dielectric film in the at least one of the plurality of acoustic wave resonators.

7. The multiplexer according to claim 1, wherein
the first filter includes the plurality of acoustic wave resonators; and
the plurality of acoustic wave resonators in the first filter include one or more series resonators on the first path and one or more parallel resonators on one or more paths connecting one or more nodes on the first path to a ground.

8. The multiplexer according to claim 1, wherein
the first filter includes the plurality of acoustic wave resonators; and
the plurality of acoustic wave resonators in the first filter include a series resonator and a longitudinally coupled resonator provided in this order from a side closer to the common terminal on the first path.

9. A multiplexer comprising:
a first filter on a first path connecting a common terminal to a first terminal;
a second filter on a second path connecting the common terminal to a second terminal; and
a third filter on a third path connecting the common terminal to a third terminal; wherein a frequency of intermodulation distortion generated by a first signal of a frequency within a pass band of the first filter and a second signal of a frequency within a pass band of the second filter is within a pass band of the third filter;

at least one of the first filter and the second filter includes a plurality of acoustic wave resonators; and a relative permittivity of an acoustic wave resonator of the plurality of acoustic wave resonators that is closest to the common terminal is lowest among relative permittivities of the plurality of acoustic wave resonators.

10. The multiplexer according to claim 9, wherein a pass band of one of the first filter and the second filter is equal to or more than about 1920 MHz and less than or equal to about 1980 MHz;

a pass band of another one of the first filter and the second filter is equal to or more than about 1710 MHz and less than or equal to about 1785 MHz; and a pass band of the third filter is equal to or more than about 2110 MHz and less than or equal to about 2200 MHz.

11. The multiplexer according to claim 9, wherein another one of the first filter and the second filter includes a plurality of acoustic wave resonators; and in the another one of the first filter and the second filter, a relative permittivity of an acoustic resonator of the plurality of acoustic wave resonators that is closest to the common terminal is lowest among relative permittivities of the plurality of acoustic wave resonators.

12. The multiplexer according to claim 11, wherein the second filter includes the plurality of acoustic wave resonators; and the plurality of acoustic wave resonators provided in the second filter include one or more series resonators on the second path and one or more parallel resonators on one or more paths connecting one or more nodes on the second path to a ground.

13. The multiplexer according to claim 11, wherein the second filter includes the plurality of acoustic wave resonators; and the plurality of acoustic wave resonators provided in the second filter include a series resonator and a longitudinally coupled resonator provided in this order from a side closer to the common terminal on the second path.

14. The multiplexer according to claim 9, wherein the acoustic wave resonator closest to the common terminal includes an IDT electrode, a piezoelectric substrate, and a dielectric film between the IDT electrode and the piezoelectric substrate.

15. The multiplexer according to claim 14, wherein at least one of the plurality of acoustic wave resonators other than the acoustic wave resonator closest to the common terminal includes an IDT electrode, a piezoelectric substrate, and a dielectric film between the IDT electrode and the piezoelectric substrate; and a film thickness of the dielectric film in the acoustic wave resonator closest to the common terminal is greater than a film thickness of the dielectric film in the at least one of the plurality of acoustic wave resonators.

16. The multiplexer according to claim 9, wherein the first filter includes the plurality of acoustic wave resonators; and the plurality of acoustic wave resonators in the first filter include one or more series resonators on the first path and one or more parallel resonators on one or more paths connecting one or more nodes on the first path to a ground.

17. The multiplexer according to claim 9, wherein the first filter includes the plurality of acoustic wave resonators; and the plurality of acoustic wave resonators in the first filter include a series resonator and a longitudinally coupled resonator provided in this order from a side closer to the common terminal on the first path.

* * * * *